US007606015B2

(12) United States Patent
Tanabe

(10) Patent No.: US 7,606,015 B2
(45) Date of Patent: Oct. 20, 2009

(54) POWER SEMICONDUCTOR DEVICE ARCHITECTURE FOR OUTPUT TRANSISTOR PROTECTION

(75) Inventor: Tsuyoshi Tanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 97 days.

(21) Appl. No.: 12/007,440

(22) Filed: Jan. 10, 2008

(65) Prior Publication Data

US 2008/0170345 A1 Jul. 17, 2008

(30) Foreign Application Priority Data

Jan. 12, 2007  (JP)  ............... 2007-004255

(51) Int. Cl.
 *H02H 3/08* (2006.01)
 *H02H 9/02* (2006.01)
 *H02H 3/20* (2006.01)
 *H02H 9/04* (2006.01)
(52) U.S. Cl. ...................... 361/93.1; 361/91.1
(58) Field of Classification Search .............. None
See application file for complete search history.

(56) References Cited

U.S. PATENT DOCUMENTS

| 5,561,391 | A | * | 10/1996 | Wellnitz et al. | ............. 327/309 |
|---|---|---|---|---|---|
| 6,087,877 | A | * | 7/2000 | Gonda et al. | ............. 327/309 |
| 7,129,759 | B2 | * | 10/2006 | Fukami | ............. 327/110 |
| 7,339,775 | B2 | * | 3/2008 | Kimura | ............. 361/93.1 |
| 2002/0079944 | A1 | * | 6/2002 | Sander | ............. 327/309 |
| 2005/0068705 | A1 | * | 3/2005 | Nakahara | ............. 361/100 |
| 2005/0088216 | A1 | * | 4/2005 | Arndt et al. | ............. 327/325 |

FOREIGN PATENT DOCUMENTS

| JP | 2001-160746 | 6/2001 |
|---|---|---|
| JP | 2006-086507 | 3/2006 |

* cited by examiner

*Primary Examiner*—Albert W Paladini
*Assistant Examiner*—Dharti Patel
(74) *Attorney, Agent, or Firm*—McGinn IP Law Group, PLLC

(57) ABSTRACT

A power semiconductor device is provided with an output transistor, a load control circuit, and a pull-up circuit. The output transistor is connected between a power supply terminal provided to receive a power supply voltage and an output terminal to be connected with a load. The load control circuit is adapted to feed the gate voltage to the gate of the output transistor. When short-circuiting of the load occurs, the load control circuit stops feeding the gate voltage to the output transistor. The pull-up circuit is connected between the power supply terminal and the gate of the output transistor. The pull-up circuit is adapted to discharge electric charges on said gate of said output transistor, when short-circuiting of the load occurs with the voltage level on the power supply terminal lowered than the power supply voltage.

17 Claims, 11 Drawing Sheets

POWER SEMICONDUCTOR DEVICE ARCHITECTURE FOR OUTPUT TRANSISTOR PROTECTION

This application claims the benefit of priority based on Japanese Patent Application No. 2007-004255, filed on Jan. 12, 2007, the disclosure of which is incorporated herein by reference.

BACKGROUND OF THE INVENTION

1. Field of the Invention

The present invention is related to power semiconductor device, more particularly, to output transistor protection in power semiconductor devices.

2. Description of the Related Art

In automobiles and home electric appliances, power semiconductor devices (also called power devices or power ICs) are often used for high-current and/or high-voltage power control. Common power semiconductor devices are provided with function for protection of the output transistor from the overcurrent, which may result from circuit failure, such as short-circuiting of the load.

Japanese Laid-Open Patent Application No. 2001-160746 (hereinafter, referred to as the '746 application) discloses a power semiconductor device 101 adapted to output transistor protection, the configuration of which is illustrated in FIG. 1. The power semiconductor device 101 is provided with a power supply terminal Vcc, a ground terminal GND, an input terminal IN, and an output terminal OUT. The ground terminal GND is earth-grounded. The power supply terminal Vcc is connected to a positive electrode of a battery 111, and a negative electrode of the battery 111 is earth-grounded. The output terminal OUT is connected to one end of a load 112 and the other end of the load 112 is earth-grounded.

The power semiconductor device 101 functions as a high-side switch, connected between the load 112 and the battery 111. The power semiconductor device 101 is provided with a control circuit 102 and a switch M100 used to control the electric current through the load 112. The switch M100 is comprised of an N-channel MOSFET (Metal Oxide Semiconductor Field Effect Transistor), and therefore the switch M100 is referred to as an output MOS transistor M100, hereinafter. The output MOS transistor M100 has a drain connected to the power supply terminal, and a source connected to the output terminal OUT.

The control circuit 102 includes a charge pump circuit 103. The charge pump circuit 103 is connected to the input terminal IN on the input thereof, and connects to the gate G101 of the output MOS transistor M100 on the output thereof. The charge pump circuit 103 is connected to the power supply terminal Vcc, receiving a power supply voltage from the battery 111. The charge pump circuit 103 provides the gate voltage the output MOS transistor M100 on the gate G101 in response to a control signal received from the input terminal IN, and the output MOS transistor M100 controls the current through the load 112 in response to the gate voltage thereof.

When the control signal fed to the input signal IN is deactivated, the charge pump circuit 103 pulls down the gate voltage of the output MOS transistor M100 to the low level, to thereby turn off the output MOS transistor M100. When the control signal is activated, on the other hand, the charge pump circuit 103 pulls up the gate voltage of the output MOS transistor M100 to the high level to turn on the output MOS transistor M100. In other words, the charge pump circuit 103 boosts the power supply voltage fed from the battery 111 in response to the activation of the control signal, and outputs the boosted electric voltage to the gate G100 of the output MOS transistor M100. The output MOS transistor M100 is turned on in response to the activation of the gate voltage thereof up to the boosted power supply voltage.

It should be noted that the short-circuiting of the load 112 mentioned above means undesired electrical connection bypassing the load 112 between the output terminal OUT and the ground terminal GND; this may be caused by detachment of an insulation film and loosening of a connector, for example. When short-circuiting of the load 112 occurs, the voltage level on the power supply terminal Vcc drops to near 0V or the ground level. This is because the voltage drop mainly occurs across the power wire line between the battery 111 and the power semiconductor device 101, when the short circuiting of the load 112 occurs; the impedance of the power wire line between the battery 111 and the power semiconductor device 101 is usually much higher than the on-resistance of the output MOS transistor M100 (typically, several mΩ or several-tens of mΩ), especially when the power wire line is long (see FIG. 5A). Short-circuiting of the load 112 also causes an unacceptable increase in the output current Iout. When the current intensity of the output current Iout exceeds an allowable level, the output MOS transistor M100 may experience thermal destruction caused by the excessively large output current Iout. The output MOS transistor M100 must be off as soon as possible, when the load 112 is short-circuited.

In order to achieve protection of the output MOS transistor M100, the control circuit 102 further includes an overcurrent protection circuit 104. The power supply voltage supplied from the battery 111 to the power supply terminal Vcc is higher than the operation voltage of the overcurrent protection circuit 104.

The overcurrent protection circuit 104 monitors the output current Iout of the output MOS transistor M100. When an overcurrent event occurs for the output current Iout, the overcurrent protection circuit 104 detects the overcurrent event, determining that the current level of the output current Iout exceeds a given reference level, for example. The overcurrent protection circuit 104 then outputs an output shutoff signal to the charge pump circuit 103, and provides an electrical connection between the gate G101 of the output MOS transistor M100 and the ground terminal GND. In response to the output shutoff signal, the charge pump circuit 103 stops providing the gate voltage to the output MOS transistor M100. In addition, the overcurrent protection circuit 104 discharges electric charges accumulated on the gate G101 of the output MOS transistor M100 and thereby turn off the output MOS transistor M100. Such operation effectively provides protection of the output MOS transistor M100 from overcurrent.

The overcurrent protection circuit 104 includes a monitor circuit 105 and the overcurrent protection MOS transistor M101. The overcurrent protection MOS transistor M101 is an N channel MOSFET having a drain connected to the gate G101 of the output MOS transistor M100, and a source connected to the ground terminal GND. The monitor circuit 105 is connected between the power supply terminal Vcc and the ground terminal GND. The monitor circuit 105 is further connected to the gate of the overcurrent protection MOS transistor M101 on the output thereof.

The monitor circuit 105 effectively avoids the overcurrent destruction of the output MOS transistor M100 by monitoring the output current Iout of the output MOS transistor M100 and providing the gate voltage of the overcurrent protection MOS transistor M101 in response to the monitored output current Iout.

For example, when the current level of the output current Iout does not exceed a specific reference level, the monitor circuit 105 deactivates the gate voltage of the overcurrent protection MOS transistor M101 to turn off the overcurrent protection MOS transistor M101. When determining that the current level of the output current Iout exceeds the reference level, the monitor circuit 105 detects the occurrence of the overcurrent event, and pull up the gate voltage of the over current protection MOS transistor M101 to thereby turn on the overcurrent protection MOS transistor M101. The turn-on of the overcurrent protection MOS transistor M101 effectively avoids the overcurrent destruction of the output MOS transistor M100, allowing the discharge of the electric charges on the gate G101 of the output MOS transistor M100 to the ground terminal GND to thereby turn off the output MOS transistor M100 off.

As discussed in the '746 application, the source of the overcurrent protection MOS transistor M101 may be connected to the output terminal OUT instead of the ground terminal GND as shown in FIG. 2; such modified power semiconductor device is denoted by the numeral 101' in FIG. 2. When short-circuiting of the load 112 occurs, the power semiconductor device 101' operates similarly to the power semiconductor device 101.

Japanese Laid-Open Patent Application No. JP-A 2006-86507 discloses a modified configuration of the power semiconductor device, which is illustrated in FIG. 3. In FIG. 3, the modified power semiconductor device is denoted by the numeral 101". In the power semiconductor device 101", the overcurrent protection circuit 104 additionally includes a monitor circuit 106. The monitor circuit 106 is connected to the power supply terminal Vcc and is connected to the ground terminal GND. In addition, the monitor circuit 106 is connected to the backgate of the overcurrent protection MOS transistor M101 on the output thereof.

The monitor circuit 106 effectively avoids the overcurrent destruction of the output MOS transistor M100 by monitoring the output current Iout of the output MOS transistor M100 and controlling the backgate voltage of the overcurrent protection MOS transistor M101. The monitor circuit 106 controls the backgate voltage of the overcurrent protection MOS transistor M101 to achieve on-and-off control of the parasitic bipolar transistor of the overcurrent protection MOS transistor M101.

Specifically, when the current level of the output current Iout does not exceed a specific reference level, the monitor circuit 106 controls the level of the backgate voltage of the overcurrent protection MOS transistor M101 to the low level to place the overcurrent protection MOS transistor M101 into the off-state. When the overcurrent event occurs, the monitor circuit 106 detects the occurrence of the overcurrent event, determining that the current level of the output current Iout exceeds the reference level, and pulls up the level of the backgate voltage of the overcurrent protection MOS transistor M101 to turn on the parasitic bipolar transistor of the overcurrent protection MOS transistor M101. The turn-on of the overcurrent protection MOS transistor M101 effectively avoids the overcurrent destruction of the output MOS transistor M100 by discharging electric charges accumulated on the gate G101 of the output MOS transistor M100 to the ground terminal GND, and placing the output MOS transistor M100 into the off state.

Differently from the monitor circuit 105, the monitor circuit 106 is designed to operate on an operation voltage lower than that of the monitor circuit 105. For example, as shown in FIG. 4A, the monitor circuit 106 is provided with a resistance element R1 and an overcurrent protection MOS transistor M102, which are connected in series between the power supply terminal Vcc and the ground terminal GND. The resistance element R1 is connected to the power supply terminal Vcc at one end thereof. The overcurrent protection MOS transistor M102 is an N-channel MOSFET that has a drain connected to another end of the resistance element R1, a gate connected to the power supply terminal Vcc, and a source connected to the ground terminal GND. The backgate of the overcurrent protection MOS transistor M101 is connected to a connection node N101 between the resistance element R1 and the overcurrent protection MOS transistor M102.

Such configuration of the monitor circuit 106 allows operating the parasitic bipolar transistor, denoted by the numeral Tr101 in FIG. 4B, within the overcurrent protection MOS transistor M101. FIG. 4B illustrates an exemplary section structure of the overcurrent protection MOS transistor M101. A P-well region 120 is formed within the surface portion of a semiconductor substrate. A gate electrode 121 is formed over the P-well region 120 as the gate of the overcurrent protection MOS transistor M101. Within the surface portion of the P-well region 120, $N^+$ drain and source regions 122 and 123 are formed across the gate electrode 121 as a drain and source of the overcurrent protection MOS transistor M101, respectively. A $P^+$ backgate contact region 124 is additionally formed within the surface portion of the P-well region 120, positioned away from the source region 123. The backgate contact region 124 is connected to the node N101. The parasitic bipolar transistor Tr101 operates as an NPN bipolar transistor composed of the $N^+$ source region 123, the P-well region 120, and the $N^+$ drain region 122. As shown in FIGS. 4B and 4C, the drain, the source, and the backgate of the overcurrent protection MOS transistor M101 functions as the collector, the emitter, and the base of the parasitic bipolar transistor Tr101, respectively. This implies that the parasitic bipolar transistor Tr101 is connected to the gate G101 of the output MOS transistor M100 at the collector thereof, connected to the ground terminal GND at the emitter thereof, and connected to the node N101 at the base thereof.

The parasitic bipolar transistor Tr101 effectively discharges electric charges in the gate G101 of the output MOS transistor M100 to the ground terminal GND, when an overcurrent flows through the output MOS transistor M100, even when the voltage level on the power supply terminal Vcc is low. In detail, the parasitic bipolar transistor Tr101 is turned on to provide the electrical connection between the collector and the emitter, allowing the discharge of the electric charges on the gate G101, when the node N101 has a voltage level exceeding the turn-on base-emitter voltage (the base-emitter voltage at which the parasitic bipolar transistor Tr101 is turned on), feeding a base current to the parasitic bipolar transistor Tr101.

The turn-on voltage of the parasitic bipolar transistor Tr101 is lower than the threshold voltages of the overcurrent protection MOS transistors M101 and M102 and the operation voltage of the monitor circuit 105, on which the monitor circuit 105 can detect the overcurrent event. The turn-on voltage of the parasitic bipolar transistor Tr101 is typically 0.6 V. Generally, it is hard to integrate a MOS transistor with a low threshold voltage within a power semiconductor device, because MOS transistors integrated within a power semiconductor device requires a thick gate dielectric for handling high voltage. The power semiconductor device 101" addresses achieving low voltage operation by making use of the parasitic bipolar transistor operation, instead of the MOS transistor operation. That is to say, the monitor circuit 106 can operate on an operation voltage lower than that of the monitor circuit 105. This effectively allows the monitor circuit 106 to detect the overcurrent event, before the monitor circuit 105 is activated to detect the overcurrent event.

The above-described power semiconductor device 101, 101' and 101", however, does not provide overcurrent protection for the output MOS transistor M100, when the voltage level of the power supply terminal Vcc is extremely low, as low as the ground level (or 0V), for example.

Referring to FIGS. 5A and 5B, let us consider a case in which short-circuiting occurs for the load 112 connected to the power semiconductor device 101 or 101'. In this case, the overcurrent protection circuit 104 cannot operate as desired, when the voltage level on the power supply terminal Vcc is excessively lowered, as low as the ground level, for example. When the voltage level on the power supply terminal Vcc is lower than the allowed minimum operation voltage of the monitor circuit 105, for example, the monitor circuit 105 cannot determine whether the current level of the output current Iout of the output MOS transistor M100 exceeds the reference level. In addition, when the voltage level on the power supply terminal Vcc is less than the threshold voltage of the overcurrent protection MOS transistor M101, the overcurrent protection MOS transistor M101 is never turned on. This undesirably hinders the power semiconductor devices 101 and 101' from discharging electric charges on the gate G101 of the output MOS transistor M100 to the ground terminal GND, when the overcurrent event occurs. Therefore, the output MOS transistor M100 may experience thermal destruction when the overcurrent event is continued with the output MOS transistor M100 kept turned off.

This drawback is not overcome by the power semiconductor device 101" shown in FIG. 3. Let us consider a case in which short-circuiting occurs for the load 112 connected to the power semiconductor device 101" as shown in FIGS. 5A and 5B. The overcurrent protection circuit 104 cannot normally operate neither, when the voltage level on the power supply terminal Vcc is extremely lowered, as low as the ground voltage or 0V. When the voltage level on the power supply terminal Vcc is less than the allowed operation voltage of the monitor circuit 105, for example, the monitor circuit 105 cannot determine whether the current level of the output current Iout of the output MOS transistor M100 exceeds the reference level. In addition, when the voltage level on the power supply terminal Vcc is less than the threshold voltage of the overcurrent protection MOS transistor M101, the overcurrent protection MOS transistor M101 is never turned on. Furthermore, when the voltage level on the power supply terminal Vcc is lower than the turn-on voltage of the parasitic bipolar transistor Tr101 in the monitor circuit 106 (typically, 0.6V), that is, when the voltage level on the node N101 is lower than the turn-on base-emitter voltage of the parasitic bipolar transistor Tr101, prohibiting the base current from being fed to the parasitic bipolar transistor Tr101, electric charges on the gate G101 of the output MOS transistor M100 are not discharged with the parasitic bipolar transistor Tr101 turned off. As a result, the conventional power semiconductor device 101" does not discharge electric charges on the gate G101 of the output MOS transistor M100 to the ground terminal GND when the overcurrent event occurs. The output MOS transistor M100 may experience thermal destruction, when the overcurrent event is continued thereafter with the output MOS transistor M100 kept turned off.

SUMMARY

In an aspect of the present invention, a power semiconductor device is provided with an output transistor, a load control circuit, and a pull-up circuit. The output transistor is connected between a power supply terminal provided to receive a power supply voltage and an output terminal to be connected with a load. The load control circuit is adapted to feed the gate voltage to the gate of the output transistor. When short-circuiting of the load occurs, the load control circuit stops feeding the gate voltage to the output transistor. The pull-up circuit is connected between the power supply terminal and the gate of the output transistor. The pull-up circuit is adapted to discharge electric charges on said gate of said output transistor, when short-circuiting of the load occurs with the voltage level on the power supply terminal lowered than the power supply voltage.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
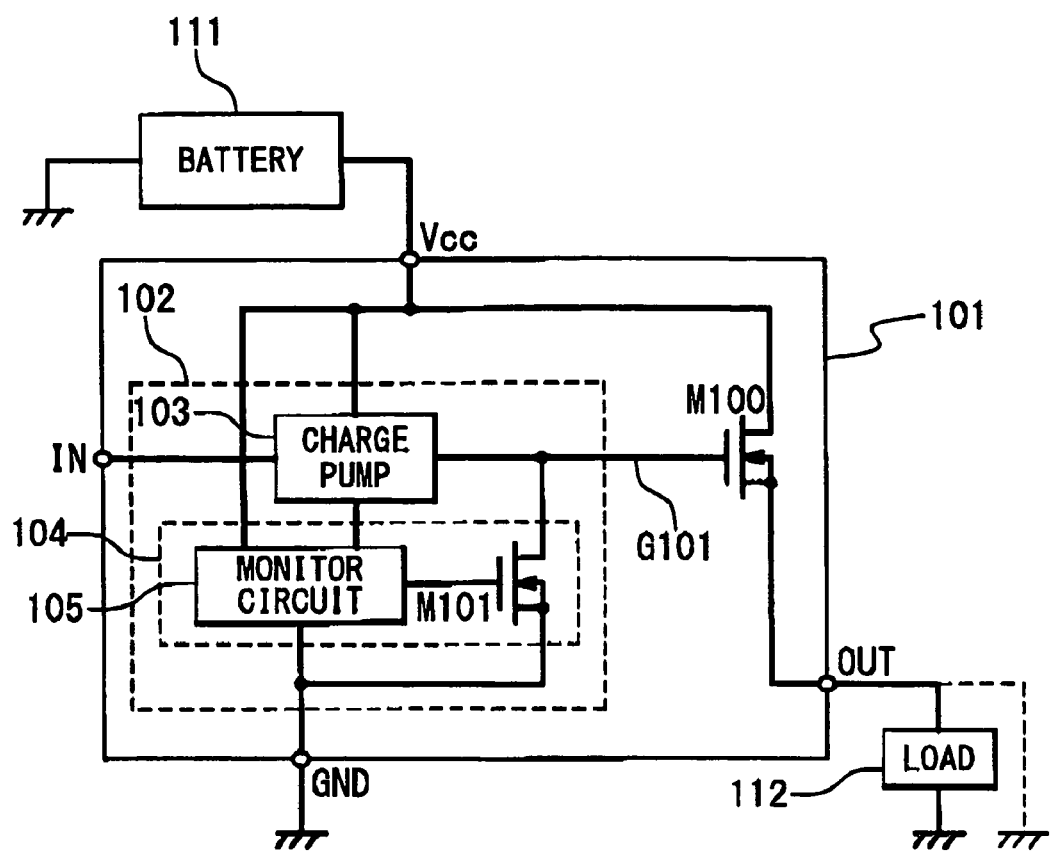
FIG. 1 shows the configuration of a conventional power semiconductor device.
Figure 2:
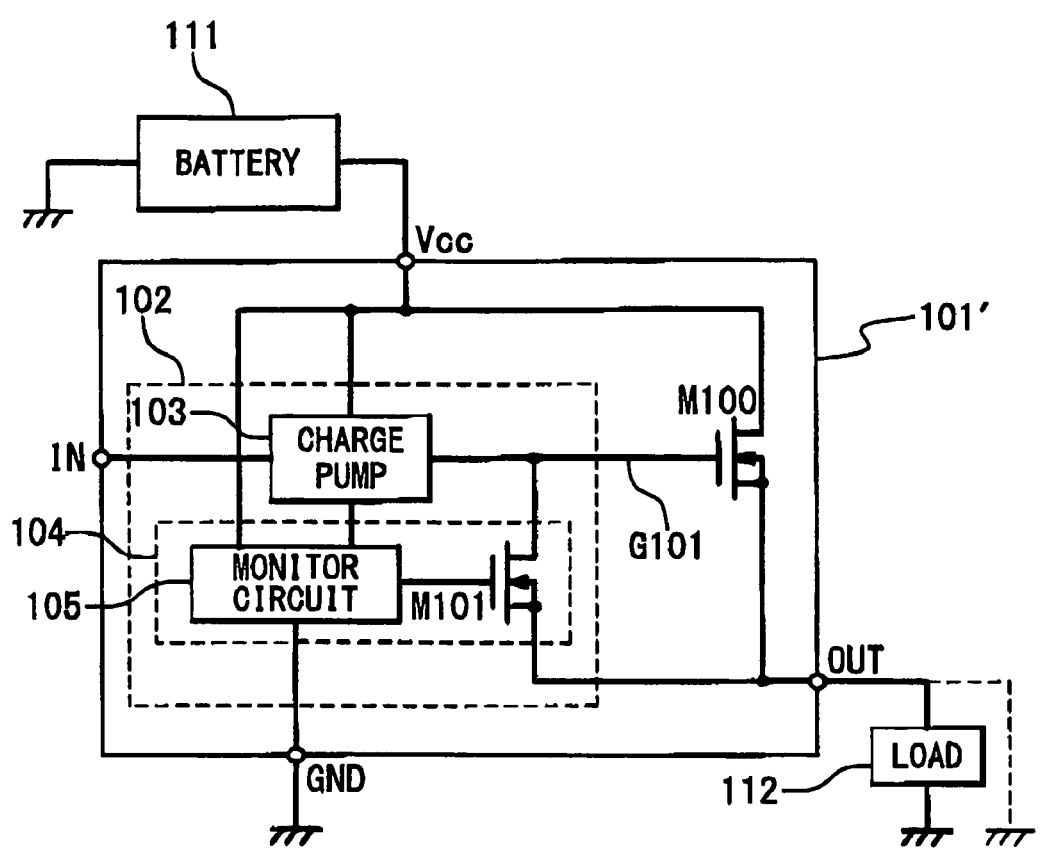
FIG. 2 shows the configuration of another conventional power semiconductor device.
Figure 3:
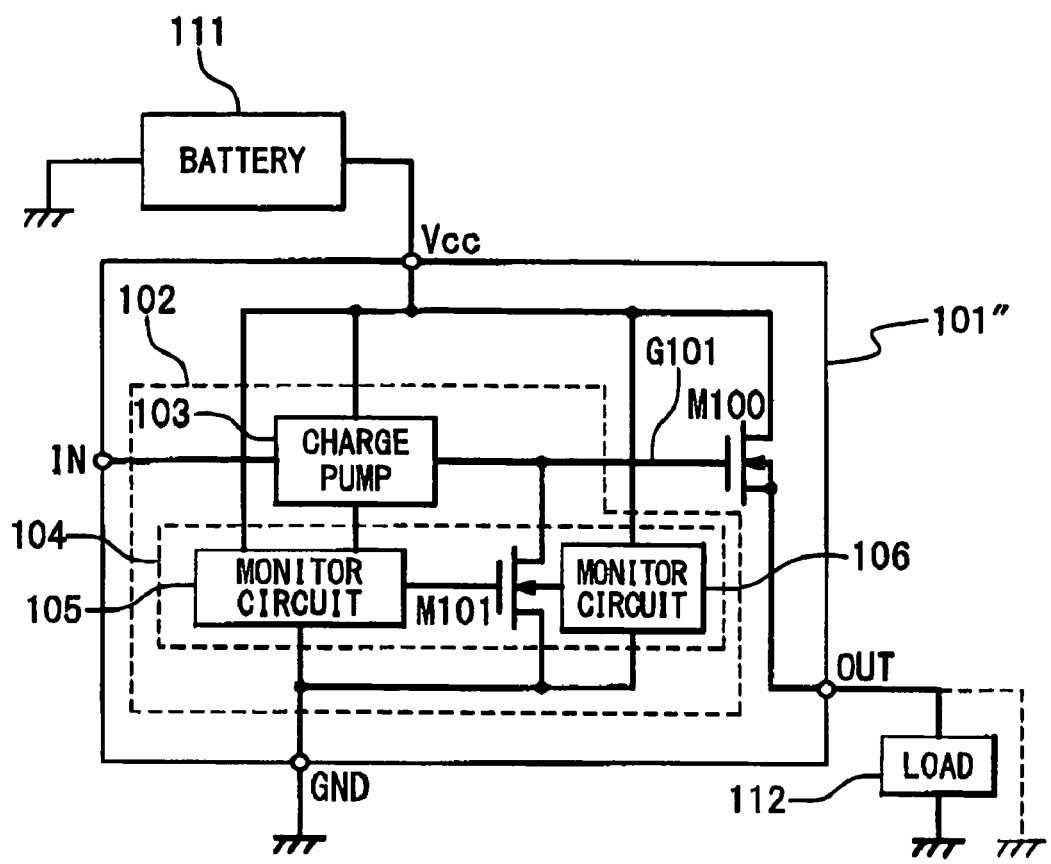
FIG. 3 shows the configuration of still another conventional power semiconductor device.
Figure 4A:
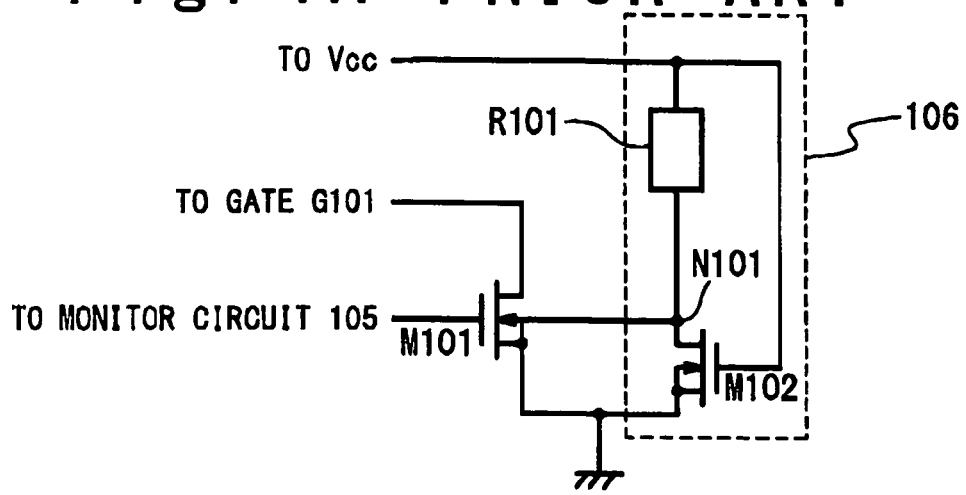
FIG. 4A shows the configuration of a monitor circuit within an overcurrent protection circuit of the power semiconductor device shown in FIG. 3.
Figure 4B:
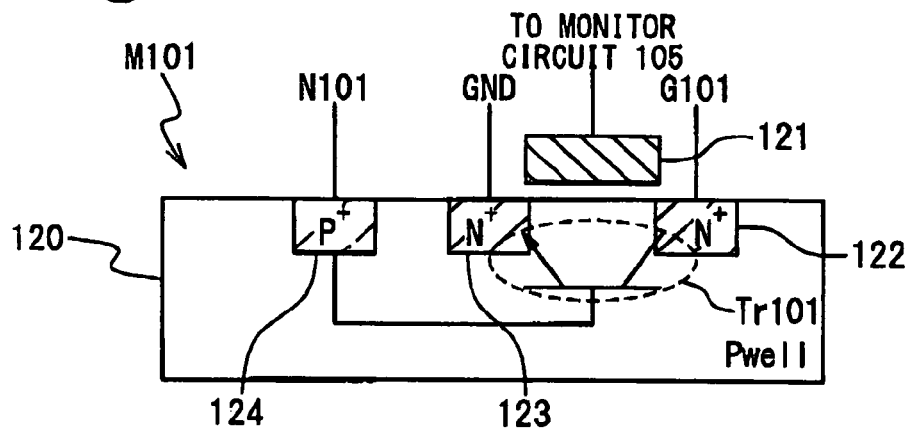
FIG. 4B shows a section view of an overcurrent protection MOS transistor integrated within the overcurrent protection circuit shown in FIG. 3, depicting a parasitic bipolar transistor incorporated therein.
Figure 4C:
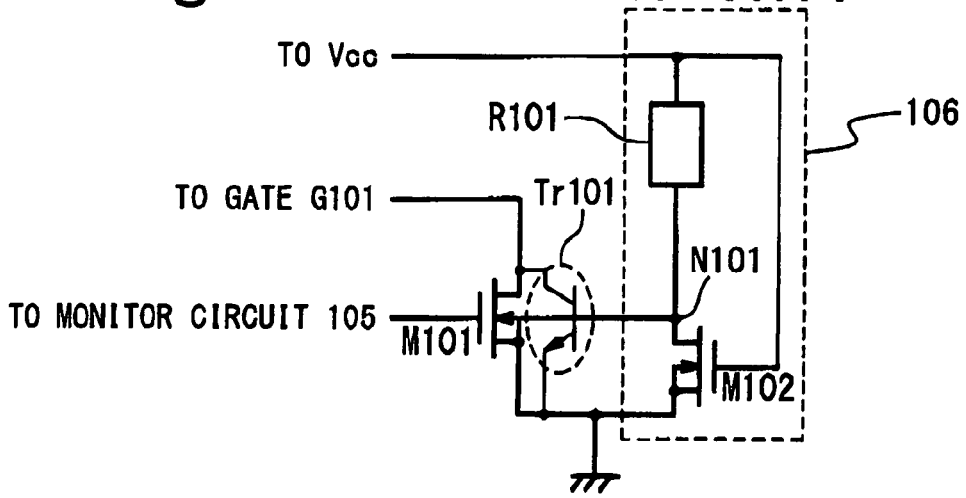
FIG. 4C shows the configuration of the monitor circuit shown in FIGS. 4A and 4B.
Figure 5A:
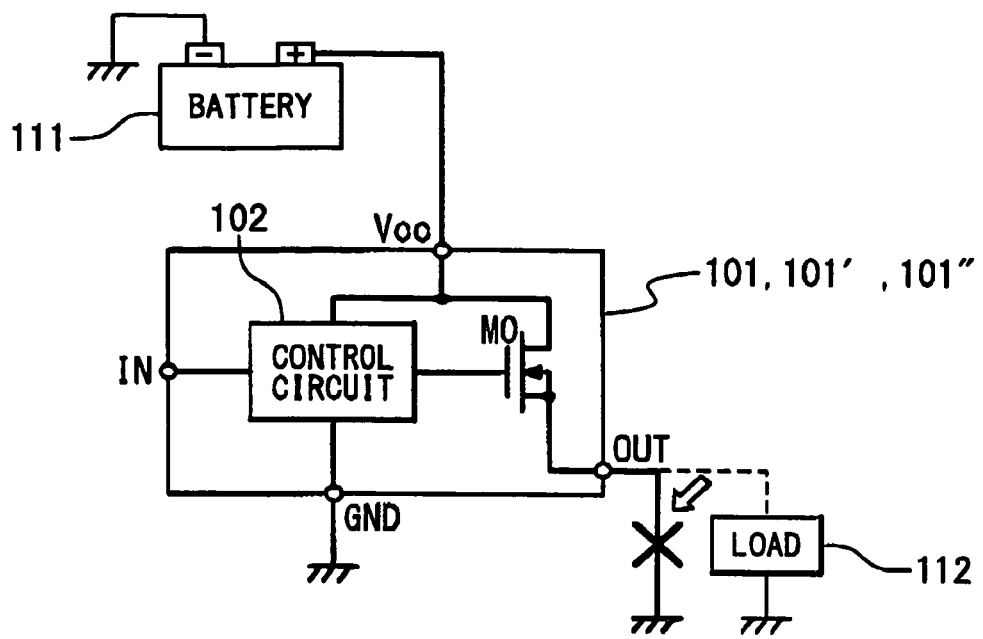
FIG. 5A is a schematic diagram for explaining the problem of the conventional power semiconductor devices.
Figure 5B:
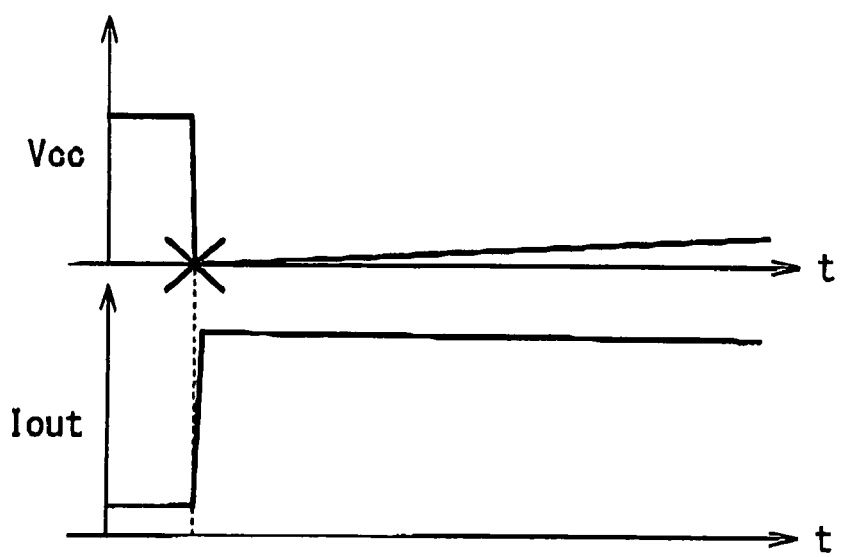
FIG. 5B is a timing chart for explaining the problem of the conventional power semiconductor devices.
Figure 6:
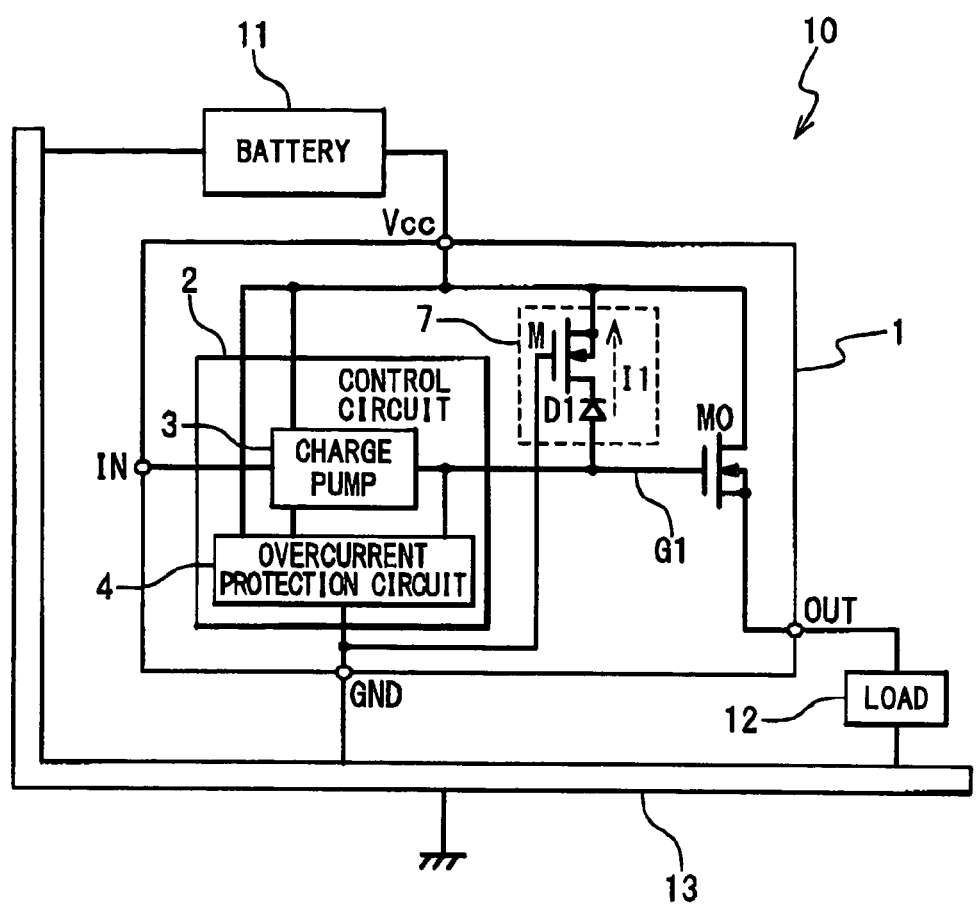
FIG. 6 shows an exemplary configuration of a system incorporating a power semiconductor device according to a first embodiment of the present invention.

FIG. 6 shows an exemplary configuration of a system 10 incorporating a power semiconductor device according to a first embodiment of the present invention. This system 10 may be applied to vehicles such as automobiles and motorcycles, home electric appliances, or robots.

In one implementation in which the system 10 is provided for an automobile, the system 10 includes a power semiconductor device 1, a battery 11, a load 12, and a chassis 13 which is a structural metal member of the automobile body. Other components of the automobile are not shown in FIG. 6 for simplicity. The voltage level on the chassis 13 is the ground level; in other words, the chassis 13 is earth-grounded.

The battery 11 is used to feed a power supply voltage from the positive electrode thereof. The negative electrode of the battery 11 is connected to the chassis 13.

The load 12 is connected to the power semiconductor device 1 on one end thereof and is connected to the chassis 13 on the other end thereof. The load 12 may be a head light, a power window system, an ABS (antilock brake system), or a valve controller of the engine, operated by the output current from the power semiconductor device 1.

The power semiconductor device 1 includes a power supply terminal Vcc, a ground terminal GND, an input terminal IN, and an output terminal OUT. The ground terminal GND is connected to the chassis 13. The power supply terminal Vcc is connected to the positive electrode of the battery 11. The output terminal OUT is connected to one end of the load 12.

The power semiconductor device 1 is provided between the battery 11 and the load 12, operating as a high-side switch. The power semiconductor device 1 is provided with a control circuit 2 and an output MOS transistor M0.

The output MOS transistor M0 may be an N-channel MOSFET or a P-channel MOSFET. It is preferable to an N-channel MOSFET as the output MOS transistor M0 for the reduction of the chip size and the enhancement of the drive ability, although the use of a P-channel MOSFET for the high-side switch may eliminate the need for providing a charge pump circuit and other circuits for gate voltage boosting, improving the circuit simplicity. In the following description, the output MOS transistor M0 is an N-channel MOSFET; however, it would be understood that the power semiconductor device operates similarly for the case when a P-channel MOSFET is used instead. The output MOS transistor M0 has a drain connected to the power supply terminal Vcc and a source connected to the output terminal OUT.

The control circuit 2 includes a charge pump circuit 3 which operates as a load control circuit that controls feeding the electric power to the load 12. The charge pump circuit 3 has an input connected to the input terminal IN and an output connected to the gate G1 of the output MOS transistor M0. The charge pump circuit 3 is also connected to the power supply terminal Vcc for receiving the power supply voltage from the battery 11. The charge pump circuit 3 feeds a gate voltage to the gate G1 of the output MOS transistor M0 for achieving load control in response to a control signal fed to the input terminal IN. The output MOS transistor M0 controls the current through the load 12 in response to the gate voltage fed thereto.

When the control signal fed to the input terminal is deactivated, for example, the charge pump circuit 3 pulls down the gate voltage of the output MOS transistor M0 to the low level to turn off the output MOS transistor M0. When the control signal is activated, on the other hand, the charge pump circuit 3 pulls up the gate voltage to the high level to turn on the output MOS transistor M0. In pulling up the gate voltage of the output MOS transistor M0, the charge pump circuit 3 generates a boosted voltage by boosting of the power supply voltage supplied from the battery 11 and feeds the boosted voltage to the gate G1 of the output MOS transistor M0. The output MOS transistor M0 is turned on in response to the pull-up of the gate voltage thereof.

The control circuit 2 further includes an overcurrent protection circuit 4 for protection of the output MOS transistor M0 from the overcurrent. The overcurrent protection circuit 4 is connected to the power supply terminal Vcc, the ground terminal GND, and the gate G1 of the output MOS transistor M0. The power supply voltage supplied from the battery 11 to the power supply terminal Vcc is higher than the operation voltage of the overcurrent protection circuit 4.

The overcurrent protection circuit 4 monitors the output current Iout of the output MOS transistor M0 to detect the occurrence of the overcurrent. For example, when the current level of the output current Iout exceeds a given reference level, the overcurrent protection circuit 4 determines that the overcurrent event occurs. In this case, the overcurrent protection circuit 4 outputs an output shutdown signal to the charge pump circuit 3, and provides an electrical connection between the gate G1 of the output MOS transistor M0 and the ground terminal GND. This allows the charge pump circuit 3 to stop feeding the gate voltage of the output MOS transistor M0 in response to the output shutdown signal. Concurrently, the overcurrent protection circuit 4 discharges electric charges on the gate G1 of the output MOS transistor M0 to turn off the output MOS transistor M0. This effectively avoids the overcurrent destruction of the output MOS transistor M0.

Figure 9:
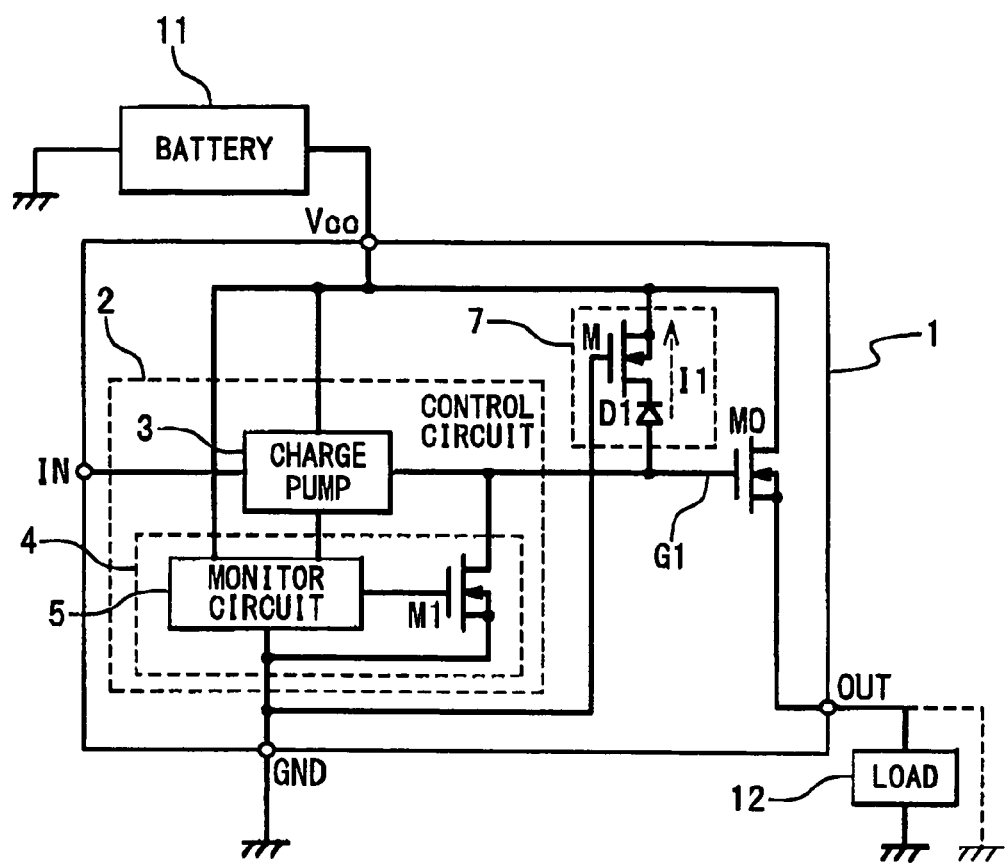
FIG. 9 shows another exemplary configuration of the power semiconductor device according to the first embodiment.

In one embodiment, the overcurrent protection circuit 4 may be structured identically to the overcurrent protection circuit 104 in the aforementioned power semiconductor device 101. In this case, as shown in FIG. 9, the overcurrent protection circuit 4 may include a monitor circuit 5 and an overcurrent protection MOS transistor M1.

The overcurrent protection MOS transistor M1 may be an N-channel MOSFET or a P-channel MOSFET. In the following description, the overcurrent protection MOS transistor M1 is supposed to be an N-channel MOSFET; however, those skilled in the art would understand that the overcurrent protection MOS transistor M1 operates similarly when a P-channel MOSFET is used. The overcurrent protection MOS transistor M1 has a drain connected to the gate G1 of the output MOS transistor M0 and a source connected to the ground terminal GND. The monitor circuit 5 is connected to the power supply terminal Vcc and is also connected to the ground terminal GND. In addition, the monitor circuit 5 is connected to the gate of the overcurrent protection MOS transistor M1 on the output thereof.

The monitor circuit 5 effectively avoids the overcurrent destruction of the output MOS transistor M0 by monitoring the output current Iout of the output MOS transistor M0 and controlling the gate voltage of the overcurrent protection MOS transistor M1.

For example, when the current level of the output current Iout does not exceed a given reference level, the monitor circuit 5 pulls down the gate voltage of the overcurrent protection MOS transistor M1 to the low level. The overcurrent protection MOS transistor M1 is turned off in response to the pull-down of the gate voltage thereof. When the current level of the output current Iout exceeds the reference level, the monitor circuit 5 determines that the overcurrent event occurs for the output current Iout, and pulls up to the gate voltage of the overcurrent protection MOS transistor M1 to turn on the overcurrent protection MOS transistor M1. The turn on of the overcurrent protection MOS transistor M1 effectively avoids the overcurrent destruction of the output MOS transistor M0 through discharging electric charges accumulated on the gate G1 of the output MOS transistor M0 to the ground terminal GND, placing the output MOS transistor M0 into the off-state.

One issue is that the overcurrent protection circuit 4 may fail to operate as desired, when the voltage level on the power supply terminal Vcc is extremely low, as low as the ground voltage (or 0V), due to the short-circuiting of the load 12.

In order to address this issue, the power semiconductor device 1 further includes a pull-up circuit 7. The pull-up circuit 7 is connected between the power supply terminal Vcc and the gate G1 of the output MOS transistor M0.

In this embodiment, the pull-up circuit 7 is provided with a pull-up MOS transistor M and a diode D1. The source and backgate of the pull-up MOS transistor M are commonly connected to the power supply terminal Vcc, and the gate of the pull-up MOS transistor M is connected to the ground terminal GND. The cathode of the diode D1 is connected to the drain of the pull-up MOS transistor M and the anode thereof is connected to the gate G1 of the output MOS transistor M0.

Figure 7:
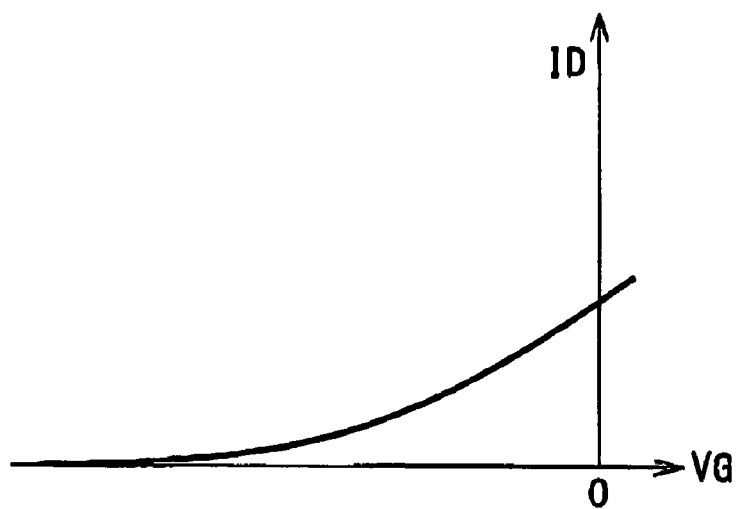
FIG. 7 shows an exemplary property of a depression-type MOS transistor.

Preferably, the pull-up MOS transistor M may be an N-channel depression type MOS transistor designed to flow a drain current therethrough for a negative gate voltage of several volts, as shown in FIG. 7. The use of the depression type MOS transistor in the power semiconductor device 1 allows discharging electric charges accumulated on the gate G1 of the output MOS transistor M0 to the power supply terminal Vcc when the voltage level on the power supply terminal Vcc is extremely low, as low as the ground voltage or 0V.

In normal operations, that is, when the load 12 is free from failure, the pull-up MOS transistor M does not operate, since the gate thereof is set to the ground level with the power supply voltage supplied to the source thereof. When the voltage level on the power supply terminal Vcc is extremely lowered as low as the ground voltage or 0V due to the short-circuiting of the load 12, the pull-up MOS transistor M discharges electric charges accumulated on the gate G1 of the output transistor M0 to the power supply terminal Vcc.

The diode D1 is used for preventing a current from flowing from the power supply terminal Vcc to the gate G1 of the output MOS transistor M0 through the pull-up MOS transistor M, when the gate voltage thereof is pulled down to the low level to turn off the output MOS transistor M0.

In the following, a description is given of the operation of the pull-up circuit 7. The pull-up circuit 7 achieves the protection of the output MOS transistor M0 by discharging electric charges on the gate G1 of the output MOS transistor M0. The protection of the output MOS transistor M0 by using the power source pull-up circuit 7 includes two modes: Mode (A) in which the pull-up circuit 7 itself completely turns off the output MOS transistor M0 by pulling down the gate voltage of the output MOS transistor M0; and Mode (B) in which the pull-up circuit 7 decreases the gate voltage of the output MOS transistor M0 by discharging electric charges therethrough to cause the decrease in the output current Iout through the output MOS transistor M0, and thereby increases the voltage level on the power supply terminal Vcc, allowing the operation of the overcurrent protection circuit 4.

Figure 8:
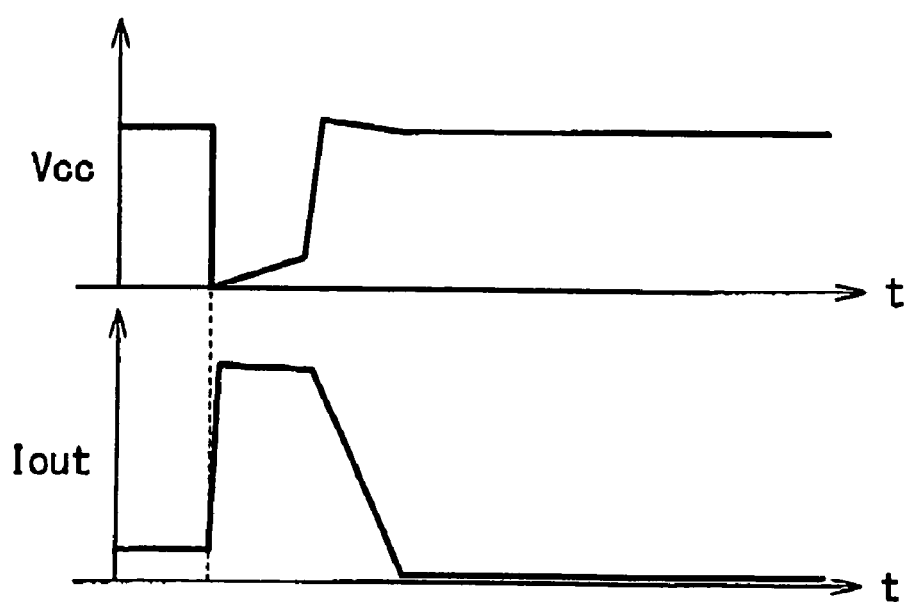
FIG. 8 is a timing chart for explaining the operation of the pull-up circuit shown in FIG. 6.

First, a description is given of Mode (A). When short-circuit of the load 12 occurs and the voltage level on the power supply terminal Vcc is extremely lowered as low as the ground voltage (or 0V) as shown in FIG. 8, the gate-source voltage of the pull-up MOS transistor M is reduced. The reduction of the gate-source voltage allows the pull-up MOS transistor M to flow a drain current and to discharge electric charges accumulated on the gate G1 of the output MOS transistor M0 to the power supply terminal Vcc. This effectively reduces the voltage level on the gate G1 of the output MOS transistor M0 and thereby turns off the output MOS transistor M0.

As described above, Mode (A) involves completely turning off the output MOS transistor M0 by the power source pull-up circuit 7 by discharging electric charges accumulated on the gate G1 of the output MOS transistor M0 to the power supply terminal Vcc.

Next, a description is given of Mode (B). During the process of Mode (A), electric charges are discharged from the gate G1 of the output MOS transistor M0 to the power supply terminal Vcc. Even when this does not result in the turn-off of the output MOS transistor M0, the overcurrent protection circuit 4 effectively operates to turn off the output MOS transistor M0 instead. More specifically, the discharge of the electric charges from the gate G1 of the output MOS transistor M0 to the power supply terminal Vcc causes the decrease in the voltage level on the gate G1 of the output MOS transistor M0, resulting in the decrease in the output current Iout through the output MOS transistor M0. This leads to the increase in the voltage level on the power supply terminal Vcc. When the voltage level on the power supply terminal Vcc is increased up to a voltage sufficiently high for the overcurrent protection circuit 4 to operate, the overcurrent protection circuit 4 starts to operate on the voltage developed on the power supply terminal Vcc. When the current level of the output current Iout of the output MOS transistor M0 exceeds a given reference level, the overcurrent protection circuit 4 provides an electrical connection between the gate G1 of the output MOS transistor M0 and the ground terminal GND, discharging the electric charges on the gate G1 of the output MOS transistor M0.

As described above, Mode (B) involves decreasing the gate voltage of the output MOS transistor M0 by discharging electric charges therethrough to cause the decrease in the output current Iout through the output MOS transistor M0, and thereby increasing the voltage level on the power supply terminal Vcc, so that the overcurrent protection circuit 4 can operate, allowing the overcurrent protection circuit 4 to completely turn off the output MOS transistor M0 by discharging electric charges accumulated in the gate G1 to the ground terminal GND.

As thus described, in Mode (A), the power semiconductor device 1 of the first embodiment discharges electric charges on the gate G1 of the output MOS transistor M0 to the power supply terminal Vcc through the power source pull-up circuit 7, allowing completely turning off the output MOS transistor M0, when the voltage level on the power supply terminal Vcc is extremely lowered as low as the ground voltage (or 0V) due to short-circuiting of the load 12. This effectively avoids the thermal destruction of the output MOS transistor M0.

In addition, in Mode (B), the power semiconductor device 1 decreases the voltage level on the gate G1 of the output MOS transistor M0 by discharging the electric charges accumulated on the gate G1 of the output MOS transistor M0 to the power supply terminal Vcc through the power source pull-up circuit 7, resulting in the decrease in the output current Iout through the output MOS transistor M0 and the increase in the voltage level on the power supply terminal Vcc, when the electric voltage on the power supply terminal Vcc is extremely lowered as low as the ground voltage (or 0V). The increase in the voltage level on the power supply terminal Vcc allows the overcurrent protection circuit 4 to operate, resulting in that the output MOS transistor M0 is completely turned off by discharging electric charges on the gate G1 to the ground terminal GND by the operation of the overcurrent protection circuit 4.

Second Embodiment

Figure 10:
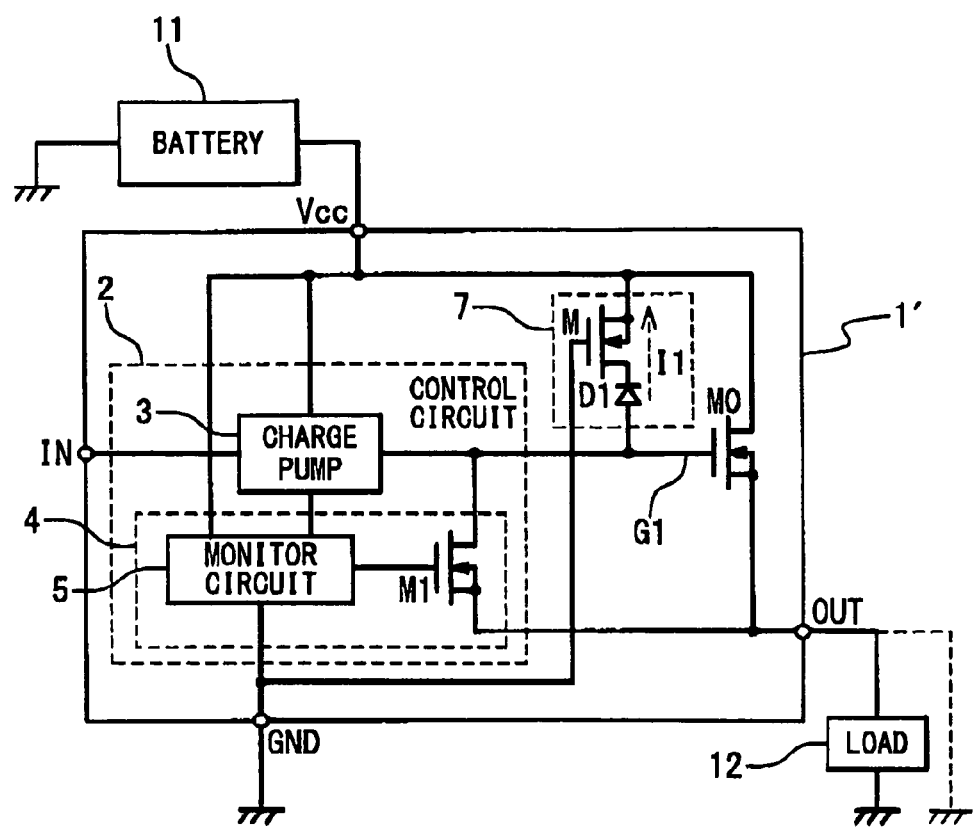
FIG. 10 shows an exemplary configuration of the power semiconductor device according to a second embodiment of the present invention.

FIG. 10 illustrates an exemplary configuration of a power semiconductor device 1' according to a second embodiment of the present invention. A detailed description is given of the power semiconductor device 1' in the following, omitting descriptions of the components already explained in the first embodiment.

In the power semiconductor device 1' of the second embodiment, the overcurrent protection circuit 104 in the control circuit 102 in the aforementioned power semiconductor device 101' is used as the overcurrent protection circuit 4 of the control circuit 2; the overcurrent protection circuit 4 includes the aforementioned monitor circuit 5 and the overcurrent protection MOS transistor M1 as shown in FIG. 10.

The drain of the overcurrent protection MOS transistor M1 is connected to the gate G1 of the output MOS transistor M0, and the source of the overcurrent protection MOS transistor M1 is connected to the output terminal OUT. The monitor circuit 5 is connected to the gate of the overcurrent protection MOS transistor M1 on the output thereof. When short-circuit of the load 12 occurs, the power semiconductor device 1' of the second embodiment operates similarly to the power semiconductor device 1 of the first embodiment, with the output terminal OUT earth-grounded.

As is the case of the power semiconductor device 1 according to the first embodiment, in Mode (A), the power semiconductor device 1' of the second embodiment discharges electric charges on the gate G1 of the output MOS transistor M0 to the power supply terminal Vcc through the power source pull-up circuit 7, allowing completely turning off the output MOS transistor M0, when the voltage level on the power supply terminal Vcc is extremely lowered as low as the ground voltage (or 0V) due to short-circuiting of the load 12. This effectively avoids the thermal destruction of the output MOS transistor M0.

In addition, in Mode (B), the power semiconductor device 1' of the second embodiment decreases the voltage level on the gate G1 of the output MOS transistor M0 by discharging the electric charges accumulated on the gate G1 of the output MOS transistor M0 to the power supply terminal Vcc through the power source pull-up circuit 7, resulting in the decrease in the output current Iout through the output MOS transistor M0 and the increase in the voltage level on the power supply terminal Vcc, when the electric voltage on the power supply terminal Vcc is extremely lowered as low as the ground voltage (or 0V). The increase in the voltage level on the power supply terminal Vcc allows the overcurrent protection circuit 4 to operate, resulting in that the output MOS transistor M0 is completely turned off by discharging electric charges on the gate G1 to the ground terminal GND by the operation of the overcurrent protection circuit 4.

Third Embodiment

Figure 11:
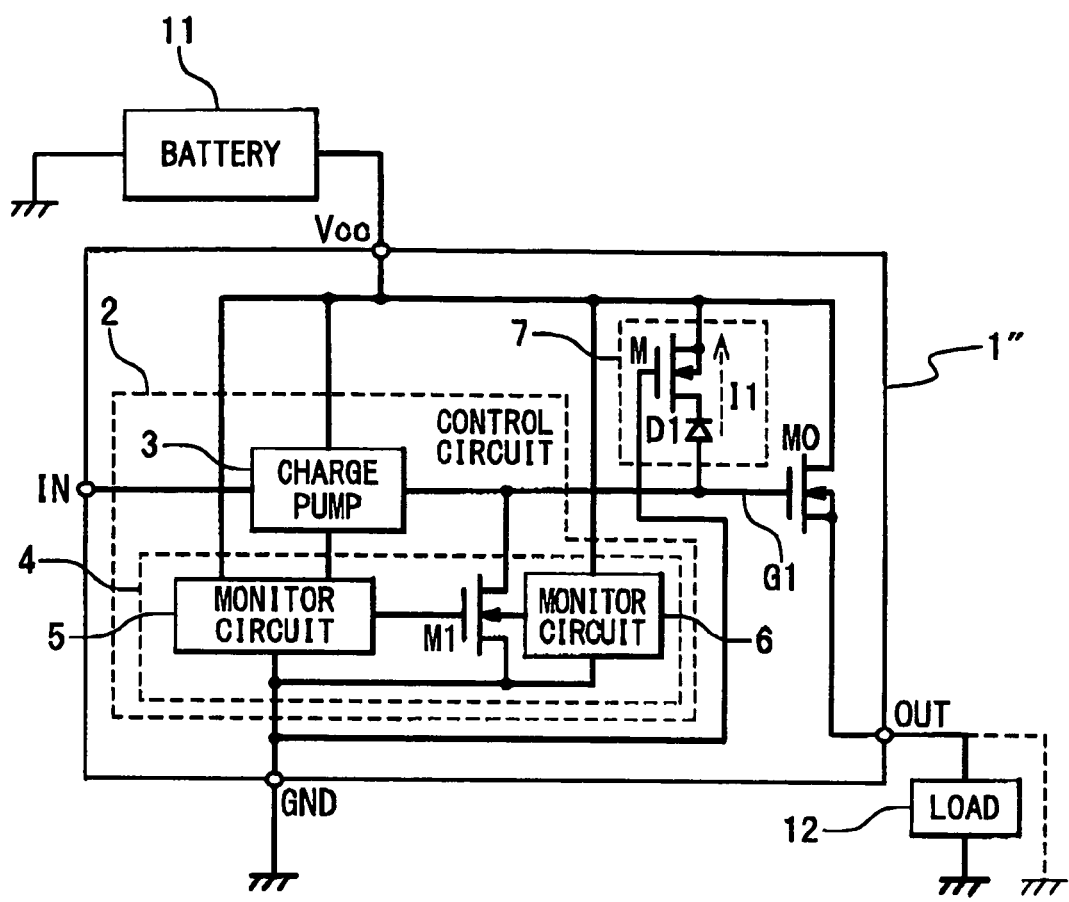
FIG. 11 shows an exemplary configuration of a power semiconductor device according to a third embodiment of the present invention.

FIG. 11 shows an exemplary configuration of a power semiconductor device 1" according to a third embodiment of the present invention. A detailed description is given of the power semiconductor device 1" in the following, omitting descriptions of the components already explained in the first and second embodiments.

In the power semiconductor device 1" according to the third embodiment, the overcurrent protection circuit 104 in the control circuit 102 in the aforementioned power semiconductor device 101" is used as the overcurrent protection circuit 4 of the control circuit 2; the overcurrent protection circuit 4 includes a monitor circuit 6 in addition to the monitor circuit 5 and the overcurrent protection MOS transistor M1.

The monitor circuit 6 is connected to the power supply terminal Vcc and connected to the ground terminal GND. In addition, the monitor circuit 6 is connected to the back gate of the overcurrent protection MOS transistor M1 on the output thereof.

The monitor circuit 6 effectively avoids the overcurrent destruction of the output MOS transistor M0 by monitoring the output current Iout of the output MOS transistor M0 and controlling the backgate voltage of the overcurrent protection MOS transistor M1. The monitor circuit 6 controls the backgate voltage of the overcurrent protection MOS transistor M1 to achieve on-and-off control of the parasitic bipolar transistor of the overcurrent protection MOS transistor M1.

Specifically, when the current level of the output current Iout does not exceed a specific reference level, the monitor circuit 6 controls the level of the backgate voltage of the overcurrent protection MOS transistor M1 to the low level to place the overcurrent protection MOS transistor M1 into the off-state. When the overcurrent event occurs, the monitor circuit 6 detects the occurrence of the overcurrent event, determining that the current level of the output current Iout exceeds the reference level, and pulls up the level of the backgate voltage of the overcurrent protection MOS transistor M1 to turn on the parasitic bipolar transistor of the overcurrent protection MOS transistor M1. The turn-on of the overcurrent protection MOS transistor M1 effectively avoids the overcurrent destruction of the output MOS transistor M0 by discharging electric charges accumulated on the gate G1 of the output MOS transistor M0 to the ground terminal GND, and placing the output MOS transistor M0 into the off state.

Figure 12A:
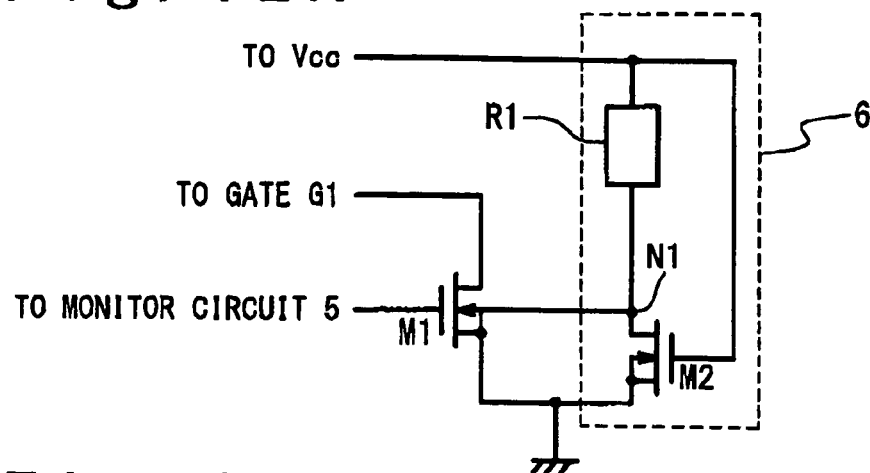
FIG. 12A shows an exemplary configuration of a monitor circuit in an overcurrent protection circuit shown in FIG. 11.

Differently from the monitor circuit 5, the monitor circuit 6 is designed to operate on an operation voltage lower than that of the monitor circuit 5. For example, as shown in FIG. 12A, the monitor circuit 6 is provided with a resistance element R1 and an overcurrent protection MOS transistor M2, which are connected in series between the power supply terminal Vcc and the ground terminal GND.

The overcurrent protection MOS transistor M2 may be an N-channel MOSFET or a P-channel MOSFET. In the following, a description is given for the case of the N-channel MOSFET; however, those skilled in the art would appreciate that the overcurrent protection circuit 4 operates similarly for the case of the P-channel MOSFET. The resistance element R1 is connected to the power supply terminal Vcc at one end thereof. The overcurrent protection MOS transistor M2 is an N-channel MOSFET that has a drain connected to another end of the resistance element R1, a gate connected to the power supply terminal Vcc, and a source connected to the ground terminal GND. The backgate of the overcurrent protection MOS transistor M1 is connected to a connection node N1 between the resistance element R1 and the overcurrent protection MOS transistor M2.

Figure 12B:
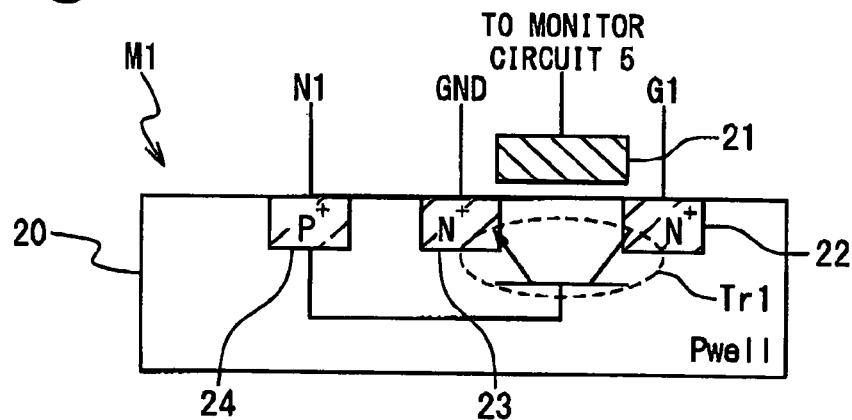
FIG. 12B shows a section view of a overcurrent protection MOS transistor integrated within the monitor circuit shown in FIG. 12A, depicting and a parasitic bipolar transistor incorporated therein.
Figure 12C:
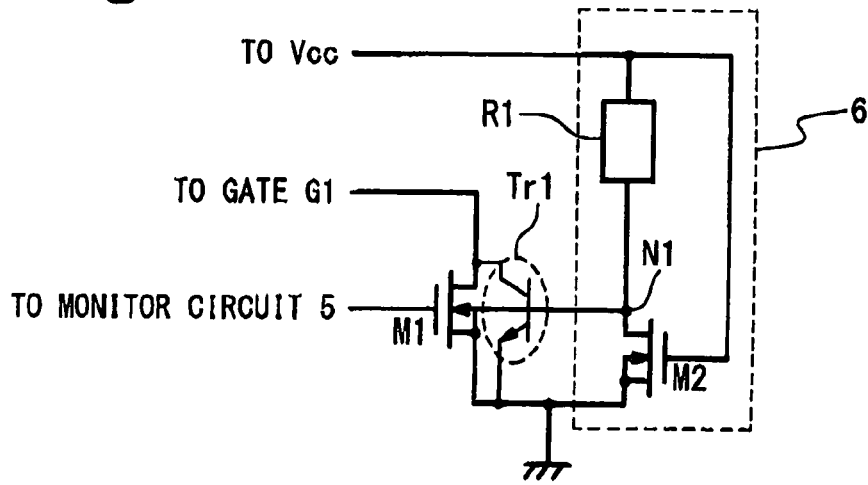
FIG. 12C shows the operation of the monitor circuit shown in FIGS. 12A and 12B.

Such configuration of the monitor circuit 6 allows operating the parasitic bipolar transistor, denoted by the numeral Tr1 in FIG. 12B, within the overcurrent protection MOS transistor M1. FIG. 12B illustrates an exemplary section structure of the overcurrent protection MOS transistor M1. A P-well region 20 is formed within the surface portion of a semiconductor substrate. A gate electrode 21 is formed over the P-well region 20 as the gate of the overcurrent protection MOS transistor M1. Within the surface portion of the P-well region 20, $N^+$ drain and source regions 22 and 23 are formed across the gate electrode 21 as a drain and source of the overcurrent protection MOS transistor M1, respectively. A $P^+$ backgate contact region 24 is additionally formed within the surface portion of the P-well region 20, positioned away from the source region 23. The backgate contact region 24 is connected to the node N1. The parasitic bipolar transistor Tr1 operates as an NPN bipolar transistor composed of the $N^+$ source region 23, the P-well region 20, and the $N^+$ drain region 22. As shown in FIGS. 12B and 12C, the drain, the source, and the backgate of the overcurrent protection MOS transistor M1 functions as the collector, the emitter, and the base of the parasitic bipolar transistor Tr1, respectively. This implies that the parasitic bipolar transistor Tr1 is connected to the gate G1 of the output MOS transistor M0 at the collector thereof, connected to the ground terminal GND at the emitter thereof, and connected to the node N1 at the base thereof.

The parasitic bipolar transistor Tr1 effectively discharges electric charges in the gate G1 of the output MOS transistor M0 to the ground terminal GND, when an overcurrent flows through the output MOS transistor M0, even when the voltage level on the power supply terminal Vcc is low. In detail, the parasitic bipolar transistor Tr1 is turned on to provide the electrical connection between the collector and the emitter, allowing the discharge of the electric charges on the gate G1, when the node N1 has a voltage level exceeding the turn-on base-emitter voltage (the base-emitter voltage at which the parasitic bipolar transistor Tr1 is turned on), feeding a base current to the parasitic bipolar transistor Tr1.

The turn-on voltage of the parasitic bipolar transistor Tr1 is lower than the threshold voltages of the overcurrent protection MOS transistors M1 and M2 and the operation voltage of the monitor circuit 5, on which the monitor circuit 5 can detect the overcurrent event. The turn-on voltage of the parasitic bipolar transistor Tr1 is typically 0.6 V. Generally, it is hard to integrate a MOS transistor with a low threshold voltage within a power semiconductor device, because MOS transistors integrated within a power semiconductor device requires a thick gate dielectric for handling high voltage. The power semiconductor device 1" addresses achieving low voltage operation by making use of the parasitic bipolar transistor operation, instead of the MOS transistor operation. That is to say, the monitor circuit 6 can operate on an operation voltage lower than that of the monitor circuit 5. This effectively allows the monitor circuit 6 to detect the overcurrent event, before the monitor circuit 5 is activated to detect the overcurrent event.

As is the case of the power semiconductor devices 1 and 1' according to the first and second embodiments, in Mode (A), the power semiconductor device 1" according the third embodiment discharges electric charges on the gate G1 of the output MOS transistor M0 to the power supply terminal Vcc through the power source pull-up circuit 7, allowing completely turning off the output MOS transistor M0, when the voltage level on the power supply terminal Vcc is extremely lowered as low as the ground voltage (or 0V) due to short-circuiting of the load 12. This effectively avoids the thermal destruction of the output MOS transistor M0.

In addition, in Mode (B), the power semiconductor device 1" of the third embodiment decreases the voltage level on the gate G1 of the output MOS transistor M0 by discharging the electric charges accumulated on the gate G1 of the output MOS transistor M0 to the power supply terminal Vcc through the power source pull-up circuit 7, resulting in the decrease in the output current Iout through the output MOS transistor M0 and the increase in the voltage level on the power supply terminal Vcc, when the electric voltage on the power supply terminal Vcc is extremely lowered as low as the ground voltage (or 0V). The increase in the voltage level on the power supply terminal Vcc allows the overcurrent protection circuit 4 to operate, resulting in that the output MOS transistor M0 is completely turned off by discharging electric charges on the gate G1 to the ground terminal GND by the operation of the overcurrent protection circuit 4.

It is apparent that the present invention is not limited to the above embodiments, but may be modified and changed without departing from the scope of the invention.

What is claimed is:

1. A power semiconductor device comprising:
   an output transistor connected between a power supply terminal provided to receive a power supply voltage and an output terminal to be connected with a load;
   a load control circuit adapted to feed said gate voltage to said gate of said output transistor, and to stop feeding said gate voltage to said output transistor when short-circuiting of said load occurs; and
   a pull-up circuit connected between said power supply terminal and said gate of said output transistor, and adapted to discharge electric charges on said gate of said output transistor, when short-circuiting of said load occurs with a voltage level on said power supply terminal lowered below said power supply voltage.

2. The power semiconductor device according to claim 1, further comprising:
   an overcurrent protection circuit monitoring an output current of said output current, configured to output an output shutdown signal to said load control circuit and to provide an electrical connection between said gate of said output transistor and a ground terminal when said output current exceeds a given reference level,
   wherein said load control circuit stops feeding said gate voltage to said output transistor in response to said output shutdown signal, and
   wherein said pull-up circuit is adapted to discharge electric charges on said gate of said output transistor so as to allow said overcurrent protection circuit to operate, when short-circuiting of said load occurs with said voltage level on said power supply terminal lowered below said power supply voltage.

3. The power semiconductor device according to claim 1, wherein said pull-up circuit includes:
   a pull-up transistor connected between said power supply terminal and said gate of said output transistor; and
   a diode connected between said pull-up transistor and said gate of said output transistor.

4. The power semiconductor device according to claim 3, wherein said pull-up transistor is an N-channel MOSFET having a source and backgate connected to said power supply terminal and a gate earth-grounded, and
   wherein said diode has a cathode connected with a drain of said pull-up transistor and an anode connected with said gate of said output transistor.

5. The power semiconductor device according to claim 4, wherein, when short-circuiting of said load occurs with said voltage level on said power supply terminal lowered below said power supply voltage, causing a decrease in a source-gate voltage of said pull-up transistor, said pull-up transistor discharges said electric charges on said gate of said output transistor by flowing a drain current therethrough to reduce said output current of said output transistor.

6. The power semiconductor device according to claim 4, wherein said pull-up transistor is a depletion type MOS transistor.

7. The power semiconductor device according to claim 2, wherein said overcurrent protection circuit includes:
   an overcurrent protection transistor connected between said gate of said output transistor and said ground terminal; and
   a monitor circuit monitoring said output current of said output transistor,
   wherein said monitor circuit feeds a gate voltage of said overcurrent protection transistor so that said overcurrent protection transistor is turned on when short-circuiting of said load occurs with said voltage level on said power supply terminal lowered below said power supply voltage.

8. The power semiconductor device according to claim 2, wherein said overcurrent protection circuit includes:
   an overcurrent protection transistor connected between said gate of said output transistor and said output terminal; and
   a monitor circuit monitoring said output current of said output transistor,
   wherein said monitor circuit feeds a gate voltage of said overcurrent protection transistor so that said overcurrent protection transistor is turned on when short-circuiting of said load occurs with said voltage level on said power supply terminal lowered below said power supply voltage.

9. The power semiconductor device according to claim 2, wherein said overcurrent protection circuit includes:
   a first overcurrent protection transistor connected between said gate of said output transistor and said ground terminal; and
   first and second monitor circuits monitoring said output current of said output transistor,
   wherein said first and second monitor circuits feeds a gate voltage and a backgate voltage of said first overcurrent protection transistor, respectively, so that said first overcurrent protection transistor is turned off when short-circuiting of said load occurs with said voltage level on said power supply terminal lowered below said power supply voltage, and
   wherein a turn-on voltage for said backgate voltage at which said overcurrent protection transistor is turned on is lower than that for said gate voltage, due to an operation of a parasitic bipolar transistor within said first overcurrent protection transistor.

10. The power semiconductor device according to claim 9, wherein said second monitor circuit comprises:
    a resistance element connected between said power supply terminal and said ground terminal; and
    a second overcurrent protection transistor connected between said resistance element and said ground terminal, and
    wherein said parasitic bipolar transistor is allowed to operate due to a connection of a backgate of said first overcurrent protection transistor to a connection node between said resistance element and said second overcurrent protection transistor.

11. The power semiconductor device according to claim 1, wherein said power supply voltage is to be fed from said battery.

12. A system comprising:
    a power semiconductor device
    a battery feeding a power supply voltage to said power semiconductor device; and
    a load receiving an output current from said power semiconductor device,
    wherein a power semiconductor device includes:
      an output transistor connected between a power supply terminal receiving said power supply voltage and an output terminal connected with said load;
      a load control circuit adapted to feed said gate voltage to said gate of said output transistor, and to stop feeding said gate voltage to said output transistor when short-circuiting of said load occurs; and
      a pull-up circuit connected between said power supply terminal and said gate of said output transistor, and adapted to discharge electric charges on said gate of said output transistor, when short-circuiting of said load occurs with a voltage level on said power supply terminal lowered below said power supply voltage.

13. A system comprising:
    a power semiconductor device
    a battery feeding a power supply voltage to said power semiconductor device;
    a load receiving an output current from said power semiconductor device; and
    a chassis connected to a negative electrode of said battery,
    wherein said power semiconductor device includes:
    an output transistor connected between a power supply terminal receiving said power supply voltage and an output terminal connected to said load;
    a load control circuit connected to a gate of said output transistor; and
    a pull-up circuit connected between said power supply terminal and said gate of said output transistor, including:
      a pull-up transistor connected to said power supply terminal and said gate of said output transistor; and
      a diode connected between said pull-up transistor and said gate of said output transistor,
    wherein said pull-up transistor is an N-channel depletion type MOSFET having a source and backgate connected to said power supply terminal and a gate earth-grounded, and
    wherein said diode has a cathode connected to a drain of said pull-up transistor and an anode connected to said gate of said output transistor.

14. The system according to claim 13, wherein said chassis and said load are commonly connected to said ground terminal.

15. The system according to claim 12, wherein said pull-up circuit includes:
    a pull-up transistor connected between said power supply terminal and said gate of said output transistor; and
    a diode connected between said pull-up transistor and said gate of said output transistor.

16. The power semiconductor device according to claim 15, wherein said pull-up transistor is an N-channel MOSFET having a source and backgate connected to said power supply terminal and a gate earth-grounded, and
    wherein said diode has a cathode connected with a drain of said pull-up transistor and an anode connected with said gate of said output transistor.

17. The power semiconductor device according to claim 16, wherein said pull-up transistor is a depletion type MOS transistor.

* * * * *